(12) United States Patent
Kim et al.

(10) Patent No.: US 8,436,256 B2
(45) Date of Patent: May 7, 2013

(54) FIXING DEVICE FOR SHIELD CAN

(75) Inventors: Kun-Tak Kim, Suwon-si (KR);
Soon-Wan Chung, Seoul (KR);
Jae-Woo Jeong, Seoul (KR);
Min-Young Park, Suwon-si (KR);
Se-Young Jang, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 198 days.

(21) Appl. No.: 12/912,280

(22) Filed: Oct. 26, 2010

(65) Prior Publication Data

US 2011/0094791 A1    Apr. 28, 2011

(30) Foreign Application Priority Data

Oct. 26, 2009 (KR) .......................... 10-2009-0101571

(51) Int. Cl.
*H05K 9/00* (2006.01)

(52) U.S. Cl.
USPC ........................... 174/382; 174/384; 361/816

(58) Field of Classification Search ................... 174/382, 174/384, 372; 361/816
See application file for complete search history.

(56) References Cited

U.S. PATENT DOCUMENTS

| | | | | |
|---|---|---|---|---|
| 4,890,199 A | * | 12/1989 | Beutler .......................... | 361/818 |
| 5,354,951 A | * | 10/1994 | Lange et al. .................. | 174/372 |
| 5,545,843 A | * | 8/1996 | Arvidsson et al. ............ | 174/355 |
| 5,577,268 A | * | 11/1996 | Ho et al. ....................... | 455/90.3 |
| 5,917,710 A | * | 6/1999 | Maatta .......................... | 361/818 |
| 6,051,781 A | * | 4/2000 | Bianca et al. ................. | 174/351 |
| 6,166,918 A | * | 12/2000 | Olofsson et al. .............. | 361/800 |
| 6,267,629 B1 | * | 7/2001 | Nguyen et al. ................ | 439/857 |
| 7,259,969 B2 | * | 8/2007 | Zarganis et al. .............. | 361/800 |
| 7,501,587 B2 | * | 3/2009 | English ......................... | 174/354 |
| 7,570,495 B2 | * | 8/2009 | Kao ............................... | 361/816 |
| 7,626,127 B2 | * | 12/2009 | Kakinoki ...................... | 174/382 |
| 2005/0236171 A1 | * | 10/2005 | Garcia .......................... | 174/350 |
| 2010/0084180 A1 | * | 4/2010 | Chiang et al. ................. | 174/377 |

FOREIGN PATENT DOCUMENTS

KR    10-0886591 A    2/2009

* cited by examiner

*Primary Examiner* — Hung Ngo
(74) *Attorney, Agent, or Firm* — Jefferson IP Law, LLP

(57) ABSTRACT

A shield can fixing device of an electronic device is provided. The fixing device includes a base having a specific length and attached to a shield can fixing line of the printed circuit board, a pair of panels, each of which is bent upwards and formed on the base to have a slit between them for inserting a lateral portion of the shield can, at least one opening portion formed in any one or both of the panels, and an insertion protrusion formed in the lateral portion located in a corresponding position to the opening portion in a protruding manner to ensure a fixing force of the shield can. The shield can fixing device is fixed by inserting a lateral portion of a shield can between double walls.

20 Claims, 8 Drawing Sheets

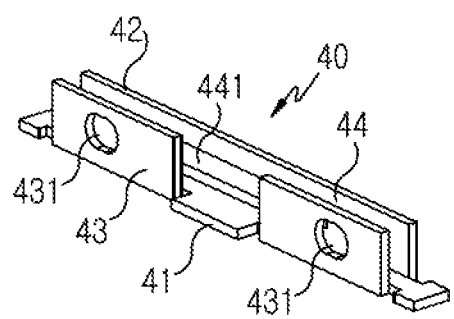
FIG.3A
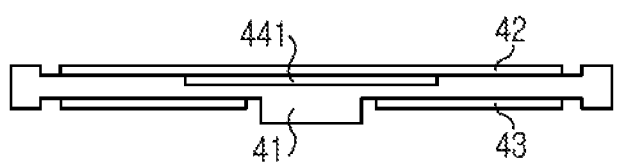
FIG.3B
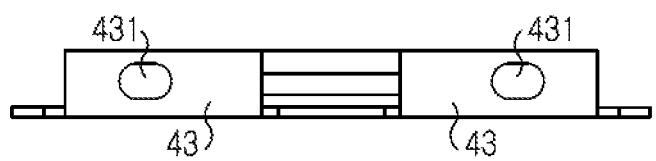
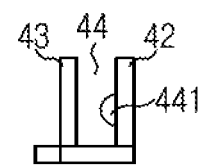
FIG.3C  FIG.3D

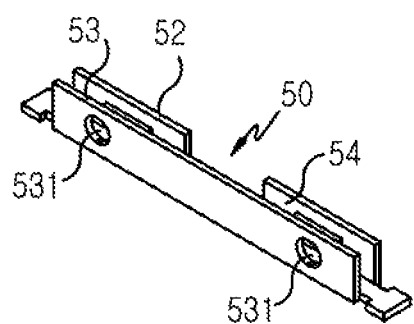
FIG.4A
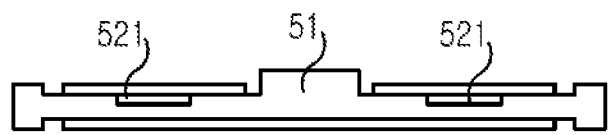
FIG.4B
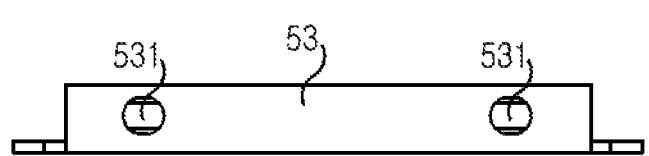 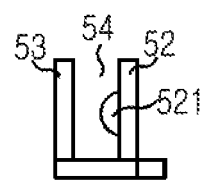
FIG.4C     FIG.4D

FIXING DEVICE FOR SHIELD CAN

PRIORITY

This application claims the benefit under 35 U.S.C. §119 (a) of a Korean patent application filed in the Korean Intellectual Property Office on Oct. 26, 2009, and assigned Serial No. 10-2009-0101571, the entire disclosure of which is hereby incorporated by reference.

BACKGROUND OF THE INVENTION

1. Field of the Invention

The present invention relates to a fixing device for a shield can for shielding electromagnetic waves generated in electronic function groups placed on a printed circuit board of various electronic devices. More particularly, the present invention relates to a fixing device for a shield can capable of contributing improvement of product reliability while providing an advantage in terms of workability, maintenance, and space utilization.

2. Description of the Related Art

In general, various electronic devices or communication devices provide a variety of contents, and include a printed circuit board to electrically connect their contents. When using the electronic devices or the communication devices, various electronic function groups placed on the printed circuit board may produce harmful electromagnetic waves. Therefore, the electromagnetic waves produced in the various electronic devices are strictly regulated.

For example, an environmental compatibility test is used to test whether the harmful electromagnetic waves are suitable for an environment, that is, to test ElectroMagnetic Compatibility (EMC).

The EMC is classified into two types, i.e., ElectroMagnetic Interference (EMI) and ElectroMagnetic Susceptability (EMS), each of which is strictly regulated since it can harm the human body. Therefore, many devices have been proposed to avoid exposure to the electromagnetic waves in advance by strict regulation of the EMC test.

For example, in order to shield electromagnetic waves produced in respective elements placed on a printed circuit board used in a portable terminal, a coating may be applied by using EMI spread or vacuum evaporation, or a shield can may be placed on the printed circuit board.

The aforementioned methods are generally used in combination, and the shield can is necessarily configured. In particular, various methods of placing the shield can on the printed circuit board are known. Examples of these methods include a mechanical combining method, a clip-type combining method, a frame-type combining method, etc.

The mechanical combining method combines the shield can to the printed circuit board by using a plurality of screws, and has advantages in terms of maintenance, but also has disadvantages in terms of product reliability such as screw deviation due to long-term use.

The clip-type combining method first places a clip on the printed circuit board along an outer edge of the shield can, and then fixes the shield can to the clip. This method has advantages in terms of maintenance and manufacturing costs, but also has disadvantages in terms of reliability, such as deviation of the shield can from the clip due to even a slight impact.

The frame-type combining method installs an additional frame by enclosing electronic function groups on the printed circuit board and fixes the shield can to the frame. Although reliability is excellent, it is difficult to apply this method to a slim-type product since a large area is used on the printed circuit board.

SUMMARY OF THE INVENTION

An aspect of the present invention is to address at least the above-mentioned problems and/or disadvantages, and to provide at least the advantages described below. Accordingly, an aspect of the present invention is to provide a fixing device for a shield can having excellent bonding force, maintenance, space utilization, and manufacturability characteristics.

Another aspect of the present invention is to provide a fixing device for a shield can of sufficient durability for long-time use, to ensure product reliability.

In accordance with an aspect of the present invention, a shield can fixing device, having a printed circuit board on which a plurality of electronic function groups are placed and a metal shield can which is placed on the printed circuit board to cover the electronic function groups in order to shield electromagnetic waves and of which a lateral portion is formed along an edge to have a specific height, is provided. The fixing device includes a base having a specific length and attached to a shield can fixing line of the printed circuit board, a pair of panels, each of which is bent upwards and formed on the base to have a slit with a specific slit for inserting the lateral portion, at least one opening portion formed in any one or both of the panels, and an insertion protrusion formed in the lateral portion of the shield can located in a corresponding position of the opening portion in a protruding manner to ensure a fixing force of the shield can.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which:

FIG. 3 is a perspective view of a shield can fixing device, and corresponding views, according to an exemplary embodiment of the present invention;

FIG. 4 is a perspective view of a shield can fixing device, and corresponding views, according to an exemplary embodiment of the present invention;

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

A shield can fixing device of the present invention may apply to printed circuit boards of various electronic devices. For example, the present invention may apply not only to a portable terminal but also to electronic devices.

Figure 1:
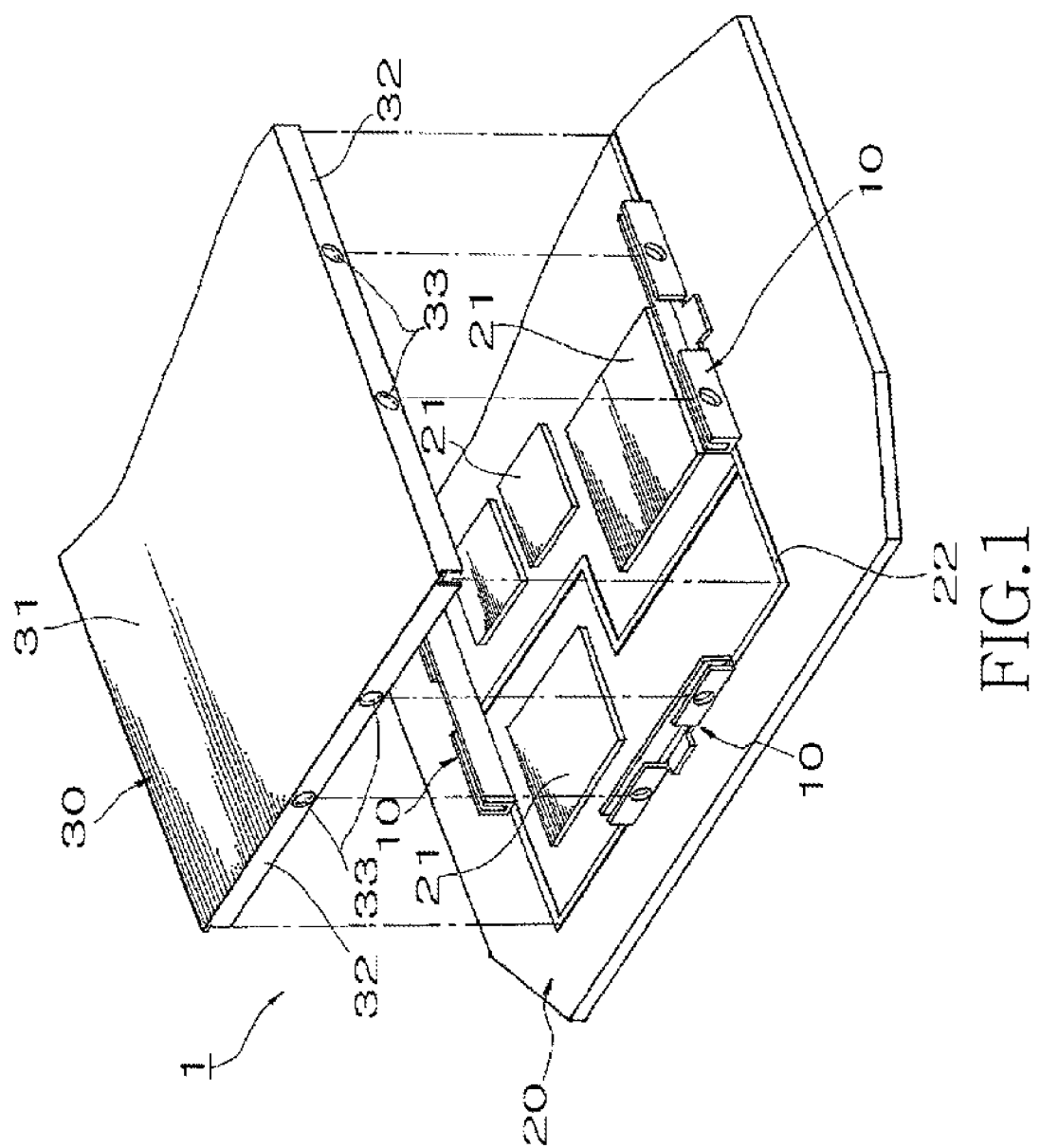
FIG. 1 is a perspective view of a shield can fixing device placed on a printed circuit board according to an exemplary embodiment of the present invention.
Figure 2A:
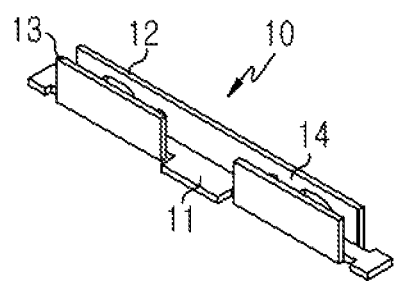
FIG. 2 is a perspective view of a shield can fixing device, and corresponding views, according to an exemplary embodiment of the present invention.
Figure 2B:
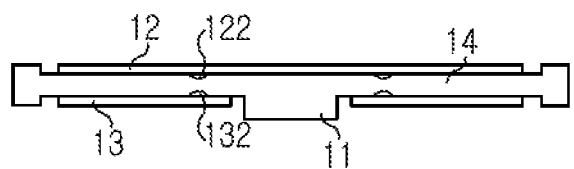
Figure 2C:
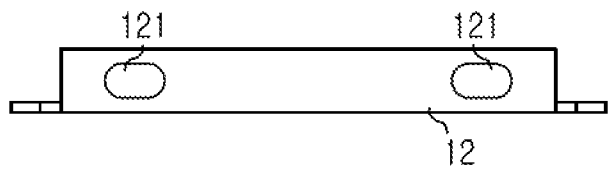
Figure 2D:
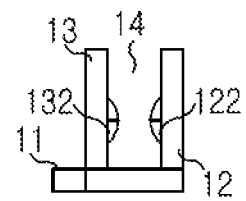
Figure 5A:
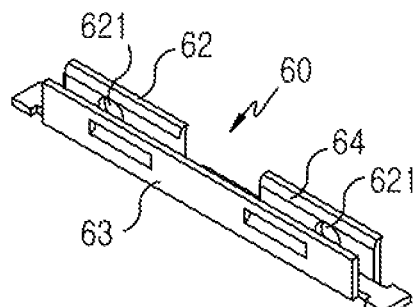
FIG. 5 is a perspective view of a shield can fixing device, and corresponding views, according to an exemplary embodiment of the present invention.
Figure 5B:
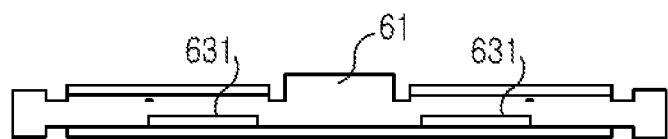
Figure 5C:
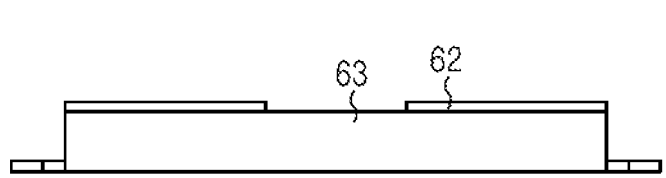
Figure 5D:
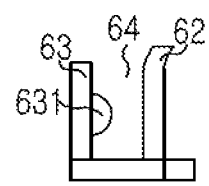
Figure 6A:
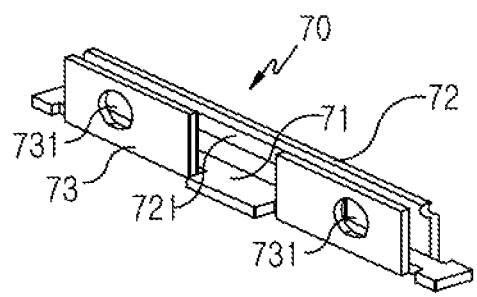
FIG. 6 is a perspective view of a shield can fixing device, and corresponding views, according to an exemplary embodiment of the present invention.
Figure 6B:
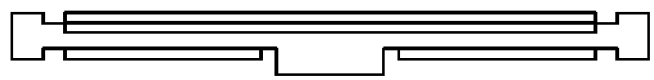
Figure 6C:
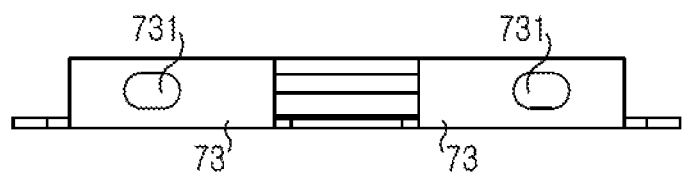
Figure 6D:
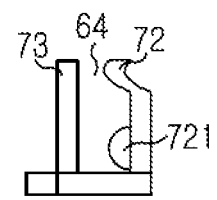

FIG. 1 is a perspective view of a shield can fixing device placed on a printed circuit board according to an exemplary embodiment of the present invention.

Referring to FIG. 1, a plurality of electronic function groups 21 are placed on a printed circuit board 20. The electronic function groups 21 are generally disposed to specific locations on the printed circuit board 20, and a shield can 30 is installed above the electronic function groups 21.

A ground line 22 is formed on the printed circuit board 20 by enclosing the electronic function groups 21. The ground line 22 is grounded to a ground portion of the printed circuit board 20. Preferably, among the electronic function groups 21, an electronic function group which radiates a relatively large amount of electromagnetic waves may be independently shielded by using an additional shield can.

A shield can fixing device 10 of the present invention is installed on the ground line 22 with a specific interval. The fixing device 10 is made of a conductive material. The fixing device 10 is installed on the ground line 22 and is electronically connected to the ground line 22. The fixing device 10 may be fixed on the ground line of the printed circuit board 20 by means of soldering, bonding, screwing, etc.

The shield can 30 has a sufficient size to cover the electronic function groups 21. A flat-type plate 31 is formed integrally with a lateral portion 32 bent along an edge of the flat-type plate 31. The lateral portion 32 provides a specific height to the shield can 30 so that the flat-type plate 31 is spaced apart by a specific distance from the electronic function groups.

As will be described below, the fixing device 10 is preferably formed in a double-wall structure to have a specific interval according to the present invention, and the interval is formed in a slit structure capable of inserting the lateral portion 32 of the shield can 30. Therefore, when the shield can 30 is forcedly inserted to an upper portion of the fixing device 10, the lateral portion 32 of the shield can 30 is closely inserted to a slit of the fixing device 10.

FIG. 2 is a perspective view of a shield can fixing device, and corresponding views, according to an exemplary embodiment of the present invention.

Referring to FIG. 2, a fixing device 10 of the present invention is formed with a base 11 having a specific width and inner and outer panels 13 and 12, respectively, which are integrally formed and are bent upwards at both ends of the base 11. That is, when the shield can 30 is placed in the shield can fixing device 10, a panel externally viewed from the shield can 30 is named as the outer panel 12, and a panel which is hidden inside the shield can 30 is named as the inner panel 13. The reason for the above is to closely insert the lateral portion 32 of the shield can 30 to a slit 14 between the inner panel 13 and the outer panel 12.

A plurality of opening portions 121 are formed in the outer panel 12 or the inner panel 13 with a specific interval to insert an insertion protrusion 33 protruding from the lateral portion 32 of the shield can 30. That is, when the lateral portion 32 of the shield can 30 is inserted to a slit 14 of the fixing device 10, the insertion protrusion 33 (not shown in FIG. 2) of the lateral portion 32 is inserted to the opening portion 121 formed in a corresponding panel of the fixing device 10, thereby completing the fixing. That is, the shield can 30 may be inserted forcedly without having to use an additional insertion protrusion or opening portion. However, such a structure is able to not only reinforce bonding force of the shield can 30, but is also able to ensure reliability, irrespective of long-term use. The insertion protrusion 33 is preferably formed in a curved shape, so that it can be easily inserted to the opening portion 121 formed in the outer panel 12.

The present invention is not limited thereto, and thus the insertion protrusion may be formed in an inner surface of the lateral portion 32 in a protruding manner, and the opening portion may be formed in a corresponding panel (i.e., the inner panel 13 in FIG. 2) of a slit.

More preferably, at least one of tension protrusions 122 and 132 are formed in a protruding manner on an inner surface of any one or both of the inner and outer panels 13 and 12. Incidentally, the term "inner surface," as used in the present application in referring to an inner or outer panel, means a surface of one of the inner or outer panels that is nearer to and facing the other panel. The reason for the above tension protrusions is to support the lateral portion 32 of the shield can 30 when the lateral portion 32 of the shield can 30 is inserted to the slit 14 of the fixing device 10, so as to maintain a state where the lateral portion 32 is closely inserted to the slit 14. The tension protrusions 122 and 132 can be formed in various shapes. In the fixing device 10 of FIG. 2, the two tension protrusions 122 and 132 are formed facing each other on an inner surface of the outer panel 12 and an inner surface of the inner panel 13, respectively, with a specific interval.

FIG. 3 is a perspective view of a shield can fixing device and corresponding views according to an exemplary embodiment of the present invention.

Referring to FIG. 3, a shield can fixing device 40 includes a base 41 that may be formed in the same shape as inner and outer panels 42 and 43, respectively, forming a slit 44 therebetween. One tension protrusion 441 may be formed on an inner surface of the inner panel 42 in a protruding manner and having a significantly long length. An opening portion 431 may be formed in the outer panel 43.

FIG. 4 is a perspective view of a shield can fixing device and corresponding views according to an exemplary embodiment of the present invention.

Referring to FIG. 4, a shield can fixing device 50 includes a base 51 and inner and outer panels 52 and 53, respectively, forming a slit 54 therebetween, that are slightly different from those of the fixing devices described above but basically have similar shapes as those of the fixing devices described above. In this case, two tension protrusions 521 are formed on the inner panel 52 in a protruding manner and in a lengthwise direction to have a specific length. An opening portion 531 may be formed in the outer panel 53.

FIG. 5 is a perspective view of a shield can fixing device and corresponding views according to an exemplary embodiment of the present invention.

Referring to FIG. 5, a shield can fixing device 60 includes a base 61 and inner and outer panels 63 and 62, respectively. Two tension protrusions 631 are formed in the inner panel 63 with a specific interval in a protruding manner. Further, an upper portion of the outer panel 62 is bent in a specific angle outwardly (i.e., away from the inner panel), so that the lateral portion 32 of the shield can 30 can be easily inserted to a slit 64 between the inner panel 63 and the outer panel 62. An opening portion 621 may be formed in the outer panel 62.

FIG. 6 is a perspective view of a shield can fixing device and corresponding views according to an exemplary embodiment of the present invention.

Referring to FIG. 6, a shield can fixing device 70 includes a base 71 and inner and outer panels 73 and 72, respectively. A tension protrusion 721 is similar to tension protrusion 441 of FIG. 3, except that an upper portion of an inner panel 72 is bent towards an outer panel 73 and is bent again upwards. Preferably, in the bent portion, a portion which comes in contact with the lateral portion 32 of the shield can 30 is curved so that the lateral portion 32 of the shield can 30 is doubly supported together with the tension protrusion 33. An opening portion 731 may be formed in the outer panel 73.

Figure 7:
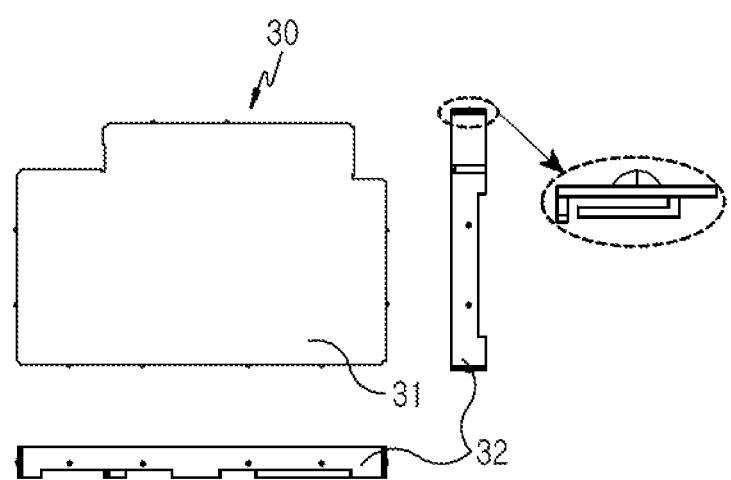
FIG. 7 is a plan view of a shield can, and a corresponding side view, according to an exemplary embodiment of the present invention.
Figure 8:
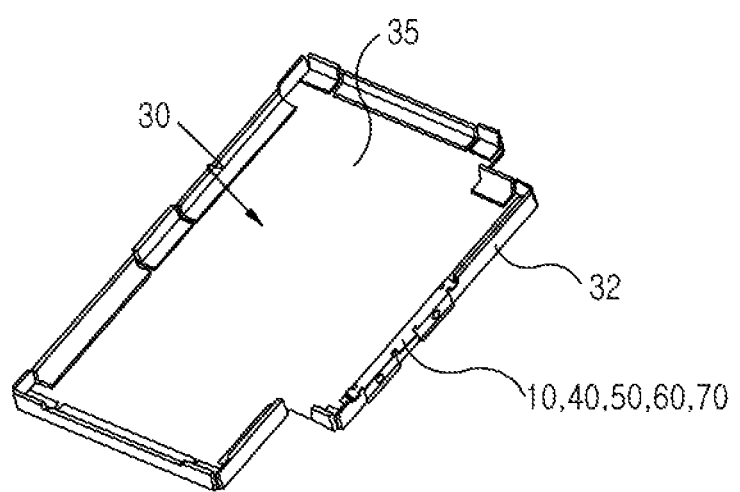
FIG. 8 is a perspective view of a base of a shield can according to an exemplary embodiment of the present invention.

FIG. 7 is a plan view of a shield can and corresponding side views according to an exemplary embodiment of the present invention. FIG. 8 is a perspective view of a base of a shield can according to an exemplary embodiment of the present invention.

Referring to FIG. 7 and FIG. 8, a lateral portion 32 of a shield can 30 has the insertion protrusion 33 of FIG. 1 formed with a specific interval in a protruding manner in an outer surface. When the lateral portion 32 of the shield can 30 is inserted to a slit of the fixing device 10, the insertion protrusion is closely inserted to the slit between respective panels in order to prevent the lateral portion 32 of the shield can 30 from being arbitrarily deviated from the fixing device 10.

The lateral portion 32 of the shield can 30 is folded while having a double-wall structure by using a hemming mechanism, and one end thereof may come in contact with a rear portion 35 which is an inner surface corresponding to a plate 31 of the shield can 30.

According to exemplary embodiments of the present invention, a shield can fixing device is fixed by inserting a lateral portion of a shield can between double walls. Therefore, manufacturability, bonding force, maintenance, and space utilization are excellent, thereby improving product reliability.

While the invention has been shown and described with reference to certain exemplary embodiments thereof, it will be understood by those skilled in the art that various changes in form and details may be made therein without departing from the spirit and scope of the present invention as defined by the appended claims and their equivalents.

What is claimed is:

1. A shield can fixing device for shielding electromagnetic waves, the fixing device comprising:
   a base having a specific length and attached to a shield can fixing line of a printed circuit board;
   a pair of substantially flat and opposing parallel panels a specific width apart from each other, each of which is bent upwards and formed on a first or opposite side of the base to comprise a slit between them of the specific width for inserting a lateral portion of the shield can;
   at least one opening portion formed in at least one of the panels; and
   an insertion protrusion formed in the lateral portion of the shield can, the insertion protrusion being located in a corresponding position of the opening portion in a protruding manner to ensure a fixing force of the shield can and to thereby locate the shield can in a predetermined location with respect to the printed circuit board.

2. The fixing device of claim 1, wherein the pair of panels includes an outer panel which is visible externally when the lateral portion is inserted into the slit and an inner panel which is then not visible externally.

3. The fixing device of claim 2, wherein at least one tension protrusion is formed in a protruding manner on an inner surface of at least one of the panels which comes in contact with the lateral portion and is capable of pressing the lateral portion when the lateral portion is inserted into the slit.

4. The fixing device of claim 3, wherein the tension protrusion is formed on an inner surface of an inner panel and of an outer panel in a protruding manner, and the respective tension protrusions face each other directly.

5. The fixing device of claim 3, wherein the tension protrusion comprises a circular shape, in which a contact surface formed with the lateral portion is curved, or a rectangular shape having a specific length.

6. The fixing device of claim 3, wherein an upper portion of at least one of an inner panel and an outer panel is bent away from the slit to guide a smooth insertion of the lateral portion.

7. The fixing device of claim 6, wherein an angle of the bend of the upper portion of the panel comprises a predetermined angle greater than 0 degrees and less than 90 degrees.

8. The fixing device of claim 3, wherein an upper portion of at least one of the inner panel and the outer panel is primarily bent in a slit direction and then is secondarily bent in an opposite direction, so that the secondarily bent portion supports the lateral portion.

9. The fixing device of claim 8, wherein a contact portion with respect to the lateral portion of the secondarily bent portion comprises a curved shape.

10. The fixing device of claim 1, wherein the lateral portion of the shield can is reinforced to comprise a double wall by folding inwardly with respect to the shield can.

11. The fixing device of claim 2, wherein the insertion protrusion protrudes from an outer side of the lateral portion, and the opening portion is formed in an outer panel of the two panels.

12. The fixing device of claim 2, wherein the insertion protrusion protrudes from an inner side of the lateral portion, and the opening portion is formed in an inner panel of the two panels.

13. The fixing device of claim 3, wherein the tension protrusion is formed in a protruding manner in an inner surface of the inner panel and an inner surface of the outer panel, and the respective tension protrusions are located alternately by staggered placement facing each other.

14. A portable terminal comprising a shield can fixing device according to claim 1.

15. A shield can fixing device for shielding electromagnetic waves, the fixing device comprising:
 a base having a specific length and attached to a shield can fixing line of a printed circuit board; and
 a pair of substantially flat and parallel opposing panels a constant specific width apart from each other, each of which is bent upwards and formed on a first or opposite side of the base to comprise a slit between them of the specific width for inserting a lateral portion of the shield can,
 wherein at least one tension protrusion is formed in a protruding manner on an inner surface of at least one of the panels which comes in contact with the lateral portion and is capable of pressing the lateral portion when the lateral portion is inserted into the slit, and
 wherein at least one of the pair of panels comprises a plurality of non-continuous panels sections.

16. The fixing device of claim 15, wherein the tension protrusion is formed on an inner surface of the inner panel and of the outer panel in a protruding manner, and the respective tension protrusions face each other.

17. The fixing device of claim 15, wherein the tension protrusion is formed in a protruding manner on an inner surface of the inner panel and an inner surface of the outer panel, and the respective tension protrusions are located alternately by staggered placement facing each other.

18. The fixing device of claim 15, wherein an upper portion of at least one of the inner panel or the outer panel is primarily bent in a slit direction and then is secondarily bent in an opposite direction, so that the secondarily bent portion supports the lateral portion.

19. An electronic device having a shield can fixing device for shielding electromagnetic waves, the shield can fixing device comprising:
 a base having a specific length and attached to a shield can fixing line of a printed circuit board; and
 a pair of substantially flat and parallel opposing panels a constant specific width apart from each other, each of which is bent upwards and formed on a first or opposite side of the base to comprise a slit between them of the specific width for inserting a lateral portion of the shield can,
 wherein at least one tension protrusion is formed in a protruding manner on an inner surface of at least one of the panels which comes in contact with the lateral portion and is capable of pressing the lateral portion when the lateral portion is inserted into the slit, and
 wherein at least one of the pair of panels comprises a plurality of non-continuous panels sections.

20. An electronic device having a shield can fixing device for shielding electromagnetic waves, the shield can fixing device comprising:
 a base having a specific length and attached to a shield can fixing line of a printed circuit board;
 a pair of substantially flat and parallel panels a specific width apart from each other, each of which is bent upwards and formed on a first or opposite side of the base to comprise a slit between them of the specific width for inserting a lateral portion of the shield can;
 at least one opening portion formed in at least one of the panels; and
 an insertion protrusion formed in the lateral portion of the shield can, the insertion protrusion being located in a corresponding position of the opening portion in a protruding manner to ensure a fixing force of the shield can and to thereby locate the shield can in a predetermined location with respect to the printed circuit board.

* * * * *